(12) United States Patent
Kimura et al.

(10) Patent No.: US 6,979,527 B2
(45) Date of Patent: Dec. 27, 2005

(54) MASTER BASE FOR FABRICATION AND METHOD FOR MANUFACTURING THE SAME

(75) Inventors: Jumi Kimura, Miyagi (JP); Moriaki Abe, Miyagi (JP); Kazuhiro Shinoda, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/261,609

(22) Filed: Sep. 30, 2002

(65) Prior Publication Data
US 2003/0122143 A1   Jul. 3, 2003

(30) Foreign Application Priority Data
Oct. 2, 2001 (JP) .............................. 2001-306803

(51) Int. Cl.[7] .............................................. G03C 5/00
(52) U.S. Cl. ...................................... 430/320; 438/22
(58) Field of Search .............................. 438/22, 23, 24, 438/25, 26, 47, 48; 430/231, 311, 313, 314, 430/315, 316, 320, 321, 323, 396, 273.1, 430/945; 250/208.1

(56) References Cited

U.S. PATENT DOCUMENTS

| | | | |
|---|---|---|---|
| 5,286,605 A | * | 2/1994 | Nishioka et al. ............. 430/311 |
| 5,587,090 A | * | 12/1996 | Belcher et al. ................ 216/17 |
| 6,475,819 B2 | * | 11/2002 | Franz ........................... 438/34 |
| 2002/0110755 A1 | * | 8/2002 | Tsai et al. .................... 430/313 |
| 2004/0082096 A1 | * | 4/2004 | Yamamoto .................... 438/70 |

* cited by examiner

*Primary Examiner*—Hoai Pham
*Assistant Examiner*—Dana Farahani
(74) *Attorney, Agent, or Firm*—Robert J. Depke; Trexler, Bushnell, Giangiorgi, Blackstone & Marr, Ltd.

(57) ABSTRACT

A master base for fabrication includes a substrate, a first photoresist layer disposed on the substrate, and a second photoresist layer disposed on the first photoresist layer, wherein the first photoresist layer attenuates or absorbs rays reflected at the interface between the first photoresist layer and the substrate to prevent the reflected rays from interfering with applied rays in a exposing step. A method for manufacturing a master base for fabrication includes the steps of forming a first photoresist layer on a substrate, baking the first photoresist layer at the setting temperature of the first photoresist layer, and forming a second photoresist layer on the first photoresist layer.

5 Claims, 2 Drawing Sheets

MASTER BASE FOR FABRICATION AND METHOD FOR MANUFACTURING THE SAME

This application claims priority to Japanese Patent Application Number JP2001-306803 filed Oct. 2, 2001 which is incorporated herein by reference.

BACKGROUND OF THE INVENTION

1. Field of the Invention

The present invention relates to master bases for fabrication, for example, a master base for manufacturing masters for the fabrication of microlens arrays, and a method for manufacturing the master base for fabrication.

2. Description of the Related Art

Currently, the following processing procedure is generally employed for manufacturing microlenses: a photoresist material is applied onto a substrate to form a photoresist layer thereon, the photoresist layer is patterned to form an array, and the obtained array is provided as a mold for microlenses.

In this processing procedure, as shown in FIG. 3, a single photoresist layer 20 is formed on a substrate 10, and the photoresist layer 20 is patterned to form a desired pattern by a photolithography method. However, there is a problem in that the obtained pattern does not have a smooth surface functioning as, for example, a lens surface. That is, steps 30 are situated on the surface of the pattern, as shown in FIG. 3B and FIG. 3C, which is a partly enlarged view of FIG. 3B.

It has been found that the above phenomenon is caused as follows: in a single photoresist layer on a substrate, rays applied to the photoresist layer interfere with rays reflected at an interface between the substrate surface and the photoresist layer surface to form standing waves and the photoresist layer is also exposed to the standing waves.

That is, when the single photoresist layer is exposed, the applied rays, which are supplied from a light source, interfere with the reflected rays to form other rays having different intensities. The formed rays having different intensities cause steps, which form the same pattern as the interference pattern, on the surface of the photoresist layer. As a result, the processed photoresist layer having an optical lens shape have steps on the surface, that is, the surface is not smooth. Therefore, when the processed photoresist layer is used as a master for manufacturing, for example, microlenses, obtained microlens have inferior converging performance due to the occurrence of scattering.

In the present invention, in order to solve the above problem, two or more photoresist layers are formed on a substrate to suppress or eliminate the adverse effects caused by rays reflected at the interface between the bottom of the photoresist layers and the substrate, as described below. However, this method employing two or more photoresist layers causes another problem. That is, in a step of forming a plurality of the photoresist layers, a photoresist layer is formed and is then pre-baked to form another photoresist layer thereon, and this procedure is repeated. In this procedure, when the formed lower photoresist layer is pre-baked at a temperature of less than 120° C., which is included in the pre-baking conditions of photoresist layers used in an ordinary photolithography method, the formed lower photoresist layer is not sufficiently cured. Therefore, when the upper photoresist layer is provided on the lower photoresist layer in this state to form a layered photoresist portion, the treatment of providing the upper photoresist layer causes the thickness of the lower photoresist layer to change so that the thickness of the entire layered photoresist portion changes. As a result, there is a problem in that the difference in thickness is increased depending on areas of the layered photoresist portion.

The difference in thickness causes a visible interference pattern over the upper surface of the layered photoresist portion.

FIG. 4 is an illustration showing a process in which the difference in thickness arises in the layered photoresist portion. As shown in FIG. 4A, a first photoresist layer 21 is formed on a substrate 10. As shown in FIG. 4B, the first photoresist layer 21 is then pre-baked at less than 120° C. When an second photoresist layer 22 is provided on the first photoresist layer 21 in this state, the flatness of the first photoresist layer 21 is damaged by the formation of the second photoresist layer 22, thereby causing waves over the top surface, as shown in FIG. 4C. This state causes the visible interference pattern described above.

If a master base prepared by the above method is used for manufacturing lenses, optical lenses having a desired performance cannot be obtained.

SUMMARY OF THE INVENTION

Accordingly, it is an object of the present invention to provide a master base for fabrication in which reflected rays are attenuated or absorbed to prevent applied rays from interfering with the reflected rays so that rays having different intensities are not formed.

It is another object of the present invention to provide a method for manufacturing a master base for fabrication having high processing preciseness, wherein the method includes the step of forming a plurality of photoresist layers and the influence of a upper sublayer on a lower sublayer is suppressed in the step to reduce the difference in thickness of the amount of the photoresist layers.

In order to achieve the above objects, the present invention provides a master base for fabrication including a substrate, a first photoresist layer disposed on the substrate, and a second photoresist layer disposed on the first photoresist layer, wherein the first photoresist layer attenuates or absorbs rays reflected at the interface between the first photoresist layer and the substrate to prevent the reflected rays from interfering with applied rays in an exposing step.

In the master base for fabrication of the present invention, the first photoresist layer may include a plurality of sublayers.

Furthermore, the present invention provides a method for manufacturing a master base for fabrication including the steps of forming a first photoresist layer on a substrate, baking the first photoresist layer at the setting temperature of the first photoresist layer, and forming a second photoresist layer on the first photoresist layer.

In the method of manufacturing a master base for fabrication of the present invention, the first photoresist layer may include a plurality of sublayers, and the plurality of sublayers may be prepared by repeating the steps of forming a sublayer comprising a photoresist material to bake the sublayer at the setting temperature of the photoresist material.

Since a layered structure having two or more photoresist layers is employed, rays reflected at the interface between the substrate and the first photoresist layer are reduced, thereby obtaining a smooth surface, which is spherical or a spherical.

Since a lower resist layer is pre-baked at a setting temperature thereof or more, for example, 120° C. or more, to set the lower photoresist layer sufficiently, the difference in thickness of the layered structure is reduced when an upper photoresist layer is formed on the lower photoresist layer, thereby eliminating a visible interference pattern. Thus, a master base for fabrication having superior processing preciseness can be obtained.

DESCRIPTION OF THE PREFERRED EMBODIMENTS

An embodiment of the present invention will now be described with reference to accompanying drawings.

Figure 1A:
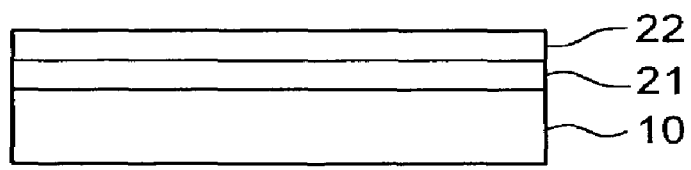
FIG. 1 is an illustration showing a process for manufacturing a master base for fabrication according to the present invention.
Figure 1B:
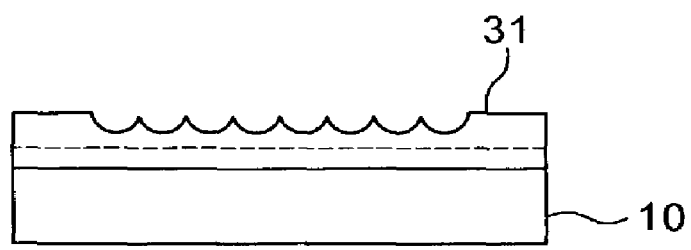

FIG. 1 is an illustration showing a process for manufacturing a master for fabrication, for example, a microlens master.

In this embodiment, in order to eliminate surface steps caused by interference due to applied rays and reflected rays in an exposure step, a first photoresist layer 21 is disposed on a substrate 10 and a second photoresist layer 22 is disposed on the first photoresist layer 21, as shown in FIG. 1. The first photoresist layer 21 attenuates or absorbs rays reflected at the interface between the substrate 10 and the first photoresist layer 21 to prevent the reflected rays from interfering with applied rays for exposure. Thus, a lens array 31 having a smooth surface, that is, a surface with no steps, can be obtained. Two or more photoresist layers may be disposed on the substrate 10.

In order to form a layer having a large thickness, a material for the layer having a large viscosity must be used. However, when such a material is used, it is difficult to form a layer having an even thickness because the material is not uniformly spread. Therefore, the first photoresist layer 21 includes a plurality of sublayers having a thickness of 2 to 10 $\mu$m so as to have a thickness sufficient to attenuate or absorb the reflected rays.

Figure 2A:
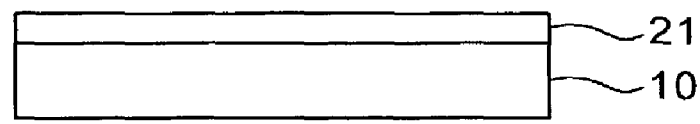
FIG. 2 is an illustration showing a method of forming photoresist layers for manufacturing a master base for fabrication according to the present invention.
Figure 2B:
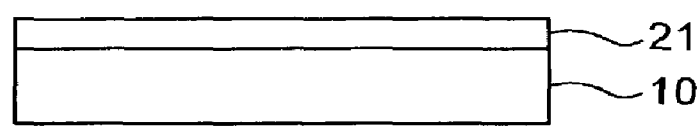

FIG. 2 is an illustration showing a method of forming photoresist layers on a substrate according to an embodiment of the present invention.

As shown in FIG. 2A, a photoresist material is applied onto the substrate 10 to form the first photoresist layer 21. The first photoresist layer 21 is then pre-baked at a temperature at which the photoresist material is sufficiently set, for example, 120° C. or more. In this embodiment, the second photoresist layer 22 is formed on the first photoresist layer 21 after the first photoresist layer 21 is completely set.

Figure 2C:
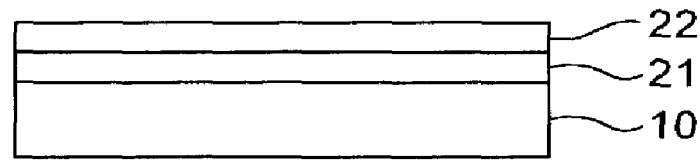
Figure 3A:
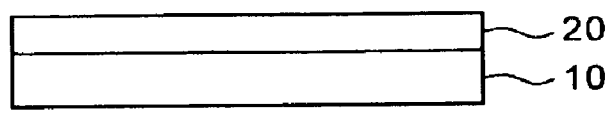
FIG. 3 is an illustration showing a process for manufacturing a conventional master base for fabrication.
Figure 3B:
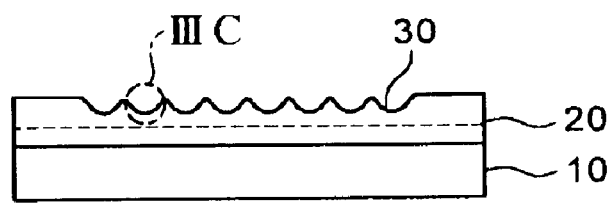
Figure 3C:
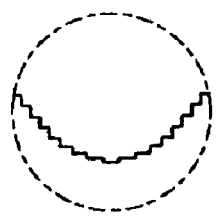
Figure 4A:
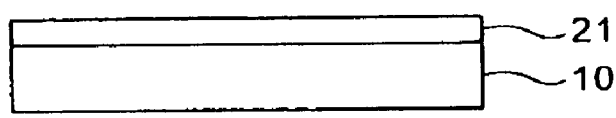
FIG. 4 is an illustration showing a step of forming photoresist layers for manufacturing a conventional master base for fabrication.
Figure 4B:
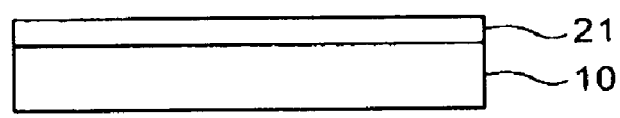
Figure 4C:
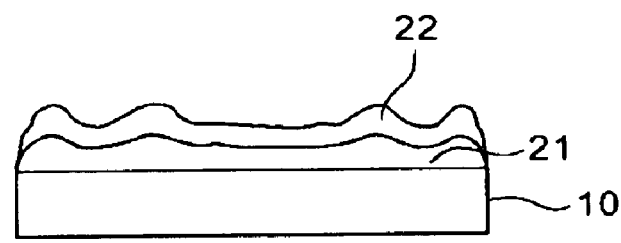

The completely set first photoresist layer 21 can maintain the flatness of the surface when the second photoresist layer 22 is formed thereon. Therefore, the second photoresist layer 22 has a flat surface, as shown in FIG. 2C.

A master base for fabrication of the present invention is then completed. The obtained master base for fabrication is patterned by exposure and development into a master having the lens array 31 with a smooth surface.

When such a master is used for manufacturing microlenses, microlenses having desired optical characteristics such as a light-converging function can be obtained.

What is claimed is:

1. A master base for fabrication comprising:
   a substrate;
   a first photoresist layer disposed as a layer over the substrate, wherein the first layer is generally smooth; and
   a second photoresist layer disposed directly over the first photoresist layer without any intervening layers,
   wherein the first photoresist layer attenuates or absorbs rays reflected at the interface between the first photoresist layer and the substrate to prevent the reflected rays from interfering with applied rays in a exposing step, the second photoresist layer being formed into an array of lens mold members having smooth concave surfaces extending upward forming a mold for a plurality of microlenses.

2. The master base for fabrication according to claim 1, wherein the first photoresist layer comprises a plurality of sublayers.

3. A lens fabricating base comprising a substrate,
   a first photoresist layer disposed as a layer over the substrate, wherein the first photoresist layer is substantially smooth; and
   a second photoresist layer disposed over the first photoresist layer, wherein the second photoresist layer has a plurality of concave cavities formed therein for molding lenses, the concave cavities having smooth surfaces extending upward forming a mold for a plurality of microlenses.

4. The master base for fabrication according to claim 3, wherein the first photoresist layer comprises a plurality of sublayers.

5. The master base for fabrication according to claim 3, wherein the first photoresist layer attenuates or absorbs rays reflected at the interface between the first photoresist layer and the substrate to prevent the reflected rays from interfering with applied rays in a exposing step.

* * * * *